United States Patent [19]

Kondou

[11] Patent Number: 5,262,992
[45] Date of Patent: Nov. 16, 1993

[54] SEMICONDUCTOR MEMORY DEVICE HAVING BIT LINE PAIRS EACH DIVIDED INTO BIT LINE SECTIONS WITH SENSE AMPLIFIER CIRCUITS

[75] Inventor: Kenji Kondou, Tokyo, Japan

[73] Assignee: NEC Corporation, Tokyo, Japan

[21] Appl. No.: 622,066

[22] Filed: Dec. 4, 1990

[30] Foreign Application Priority Data

Dec. 4, 1989 [JP] Japan .................... 1-315803

[51] Int. Cl.$^5$ .............................................. G11C 7/00
[52] U.S. Cl. ................................... 365/190; 365/205; 365/208
[58] Field of Search .................... 365/230.03, 205, 208, 365/190

[56] References Cited

U.S. PATENT DOCUMENTS

| | | | |
|---|---|---|---|
| 4,899,316 | 2/1990 | Nagami | 365/189.01 |
| 4,947,377 | 4/1990 | Hannai | 365/208 |
| 5,012,450 | 4/1991 | Mattausch et al. | 365/208 |
| 5,014,246 | 5/1991 | Komatsu et al. | 365/230.03 |
| 5,016,224 | 5/1991 | Tanaka et al. | 365/230.03 |
| 5,029,137 | 7/1991 | Hoshi | 365/208 |
| 5,097,450 | 3/1992 | Toda et al. | 365/230.03 |

FOREIGN PATENT DOCUMENTS 0185572 6/1986 European Pat. Off. .
0239208 9/1987 European Pat. Off. .

OTHER PUBLICATIONS

IBM Technical Disclosure Bulletin, vol. 31, No. 5, Oct. 1988, New York US, pp. 327-328.

Primary Examiner—Eugene R. LaRoche
Assistant Examiner—Son Dinh
Attorney, Agent, or Firm—Sughrue, Mion, Zinn, Macpeak & Seas

[57] ABSTRACT

Memory cells incorporated in a semiconductor memory device are arranged in matrix and coupled to bit line pairs, respectively, wherein each of the columns of the memory cells is divided into memory blocks coupled to bit line sections of the associated bit line pair and gate circuits accompanied with sense amplifier circuits are respectively coupled between the bit line sections for transferring a data bit through the associated gate circuits or, alternatively, data bits through difference amplifications of the associated sense amplifier circuits, thereby enhancing propagation of the data bits because the parasitic capacitance coupled to the bit line pairs are shared by the associated sense amplifier circuits.

5 Claims, 7 Drawing Sheets

SEMICONDUCTOR MEMORY DEVICE HAVING BIT LINE PAIRS EACH DIVIDED INTO BIT LINE SECTIONS WITH SENSE AMPLIFIER CIRCUITS

FIELD OF THE INVENTION

This invention relates to a semiconductor memory device and, more particularly, to bit line pairs associated with a plurality of sense amplifier circuits.

DESCRIPTION OF THE RELATED ART

A typical example of the semiconductor memory device is illustrated in FIG. 1 of the drawings and comprises a plurality of memory cells M11, M1n, M21, M2n, M31, M3n, Mm1 and Mmn arranged in rows and columns. The rows of the memory cells M11 to Mmn are coupled with a plurality of word lines W1, W2, W3 and Wm, respectively, and the columns of the memory cells M11 to Mmn are respectively associated with bit line pairs BLP1 to BLPn each consisting of first and second bit lines BL and CBL. One of the word lines W1 to Wm is shifted to an active level by a row address decoder unit 1 responsive to row address bits, and the memory cells coupled to the word line shifted to the active level are respectively conducted to the associated bit line pairs BLP1 to BLPn. The bit line pairs BLP1 to BLPn are supplied with current from charging unit 2 consisting of p-channel type field effect transistors QP1, QP2, QP3 and QP4 coupled between a source of positive voltage level Vdd and the respective bit lines BL and CBL, and the memory cells conducted to the associated bit line pairs BLP1 to BLPn causes differences in voltage level to take place on the bit line pairs BLP1 to BLPn depending upon data bits memorized therein. Namely, when activated by the word line, each of the memory cells provides a current path from either bit line BL or CBL to a ground node for producing the difference in voltage level, and the current path is formed in a channel region of a field effect transistor incorporated in each memory cell.

The bit line pairs BLP1 to BLPn are further coupled to a plurality of selector circuits 31 to 3n each consisting of transfer gates TGa and TGb, or TGna and TGnb, and a column address decoder unit 4 allows one of the selector circuits 31 to 3n to transfer the difference in voltage level to a pair of data lines DL and CDL on the basis of column bits supplied thereto. Thus, the difference in voltage level is transferred from the associated bit line pair to the data line pair DL and CDL and, then, supplied to an input/output buffer circuit (not shown).

A problem is encountered in the prior art semiconductor memory device in that the memory cells M11 to Mmn are hardly accessible at high speed. This is because of the fact that the field effect transistor incorporated in the memory cell needs to discharge the parasitic capacitance coupled to the associated bit line BL or CBL. While the semiconductor memory device is not so large in the integration density, the problem may not be serious, because the field effect transistor incorporated in each memory cell is large enough to discharge the parasitic capacitance coupled to the bit line BL or CBL with a relatively small number of memory cells. However, the number of memory cells M11 to Mmn is increased at a high annual rate, and, accordingly, the field effect transistor incorporated in each memory cell is decreased in size. The small field effect transistor may slightly speed up the data access by virtue of short channel length; however, a shrunk channel width cancels the advantage of the short channel length. This means that no improvement in current driving capability is achieved in the field effect transistor. On the other hand, the increase of the integration density results in a large number of memory cells coupled to each bit line, and the parasitic capacitance coupled to the bit line is drastically increased together with the number of the memory cells. The large amount of the parasitic capacitance is causative of low access speed, and, therefore, the aforementioned problem becomes serious from year to year.

SUMMARY OF THE INVENTION

It is therefore an important object of the present invention to provide a semiconductor memory device having memory cells which are accessible at an improved speed in spite of any increase of the integration density.

To accomplish these objects, the present invention proposes to divide each bit line pair into sections associated with sense amplifier circuits.

In accordance with the present invention, there is provided a semiconductor memory device comprising: a) a plurality of memory cells arranged in rows and columns and respectively storing data bit each in the form of difference in voltage level, each column of the memory cells being divided in a plurality of memory blocks including first and second memory blocks; b) a plurality of bit line pairs each divided into a plurality of bit line sections respectively coupled to the memory blocks of each of the columns of the memory cells, the bit line sections of each bit line pair including first and second bit line sections respectively coupled to the first and second memory blocks; c) a plurality of word lines coupled to the rows of the memory cells and activating one of the rows of the memory cells for conducting the memory cells coupled to the aforesaid one of the word lines to the bit line pairs, respectively; d) charging means for supplying current to the first bit line section of each bit line pair; e) a plurality of column selector circuits each coupled to the second bit line section of each bit line pair, the column selector circuits being operative to transfer a new data bit or one of the data bits between a data line pair and the second bit line section of one of the bit line pairs; f) a plurality of gate circuits each coupled between two of the bit line sections and responsive to a first controlling signal for transferring the new data bit between the aforesaid two of the bit line sections; and g) a plurality of sense amplifier circuits each provided in association with two of the bit line sections and responsive to a second controlling signal for transferring the data bits read out from the memory cells coupled to the aforesaid one of the word lines between the aforesaid two of the bit line sections through a difference amplification.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First Embodiment

Figure 1:
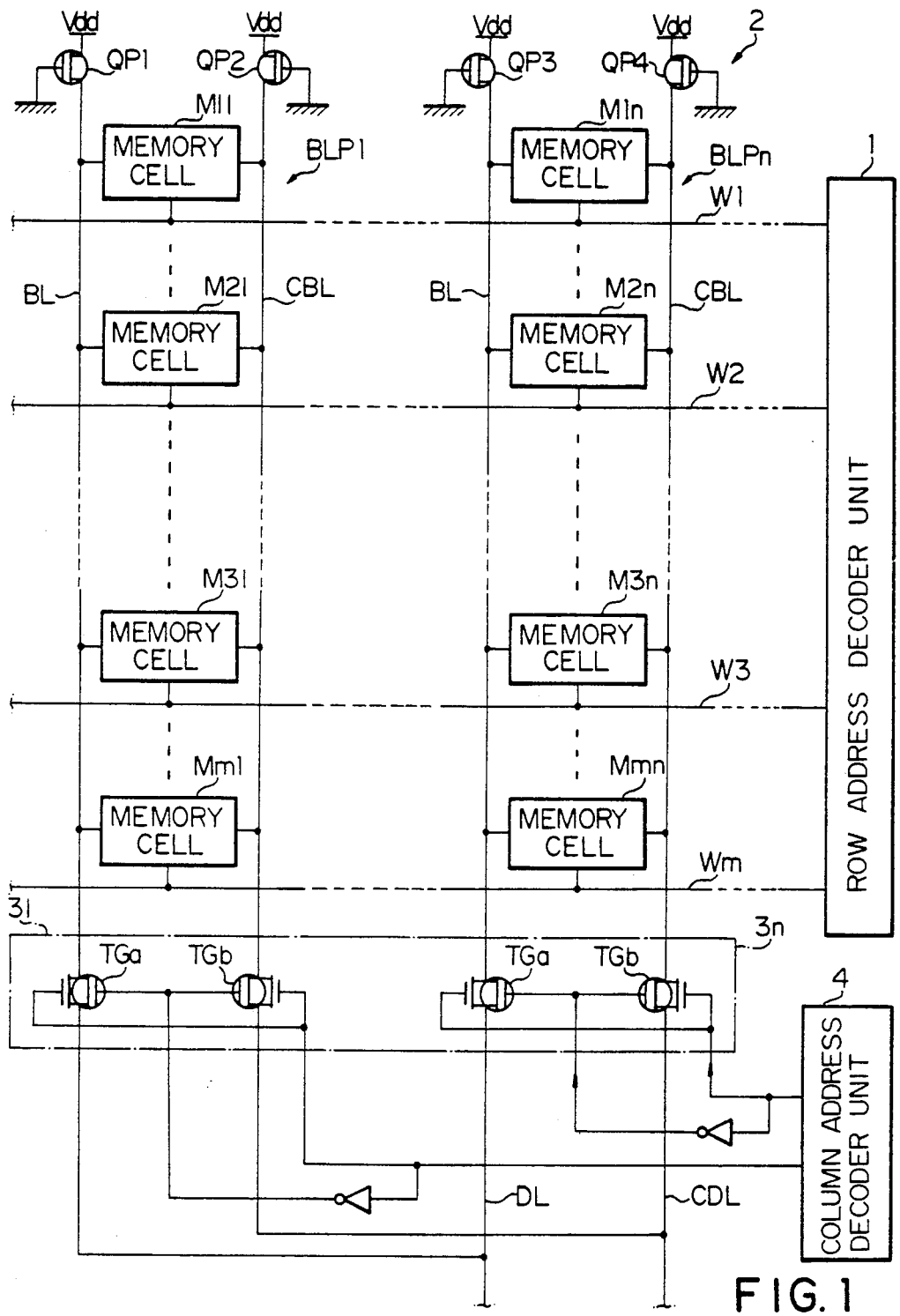
FIG. 1 is a block diagram showing the circuit arrangement of a prior art semiconductor memory device.
Figure 2:
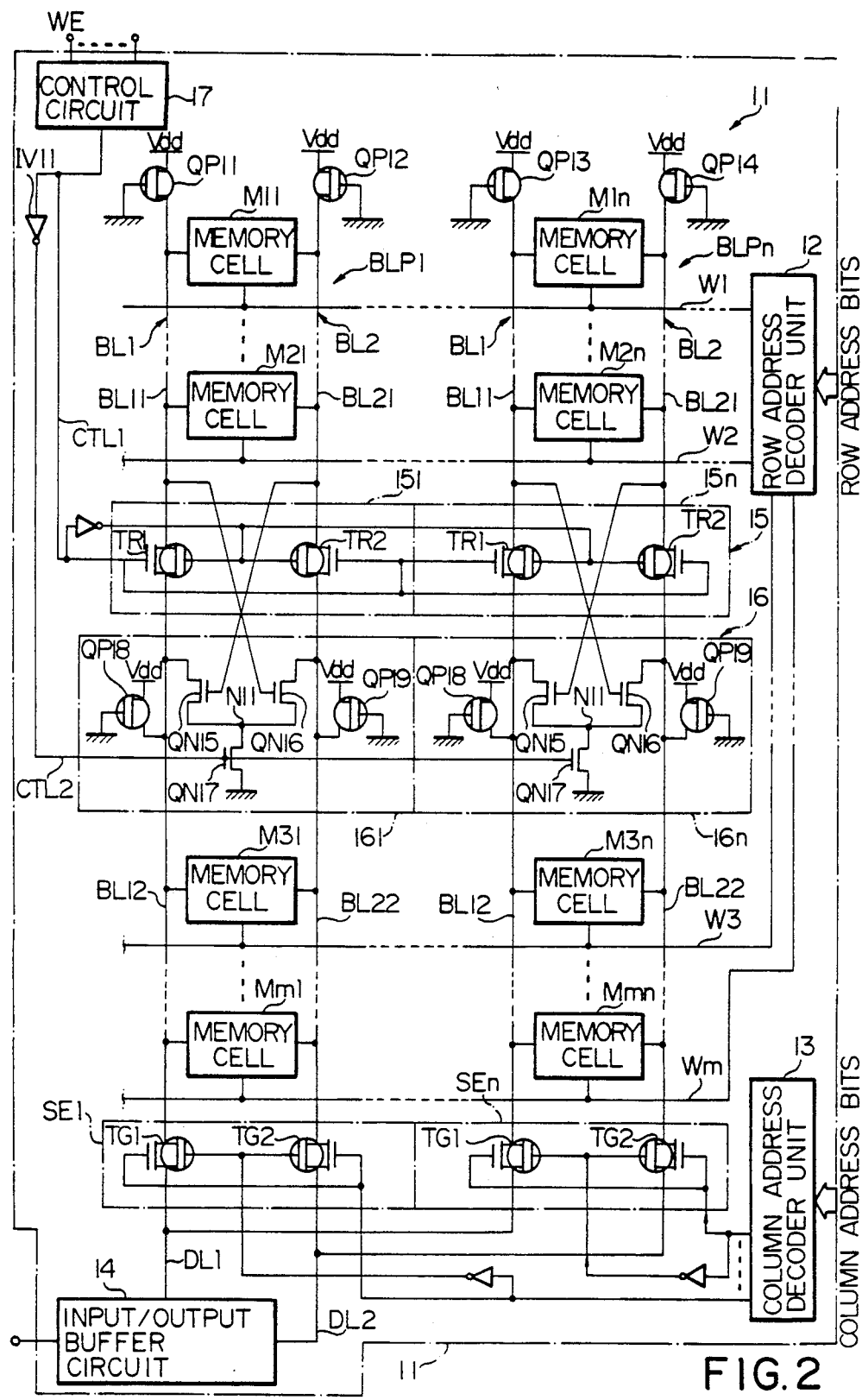
FIG. 2 is a block diagram showing the circuit arrangement of a semiconductor memory device according to the present invention.

Referring first to FIG. 2 of the drawings, a semiconductor memory device embodying the present invention is fabricated on a single semiconductor chip 10. The semiconductor memory device comprises a large number of memory cells M11, M1n, M21, M2n, M31, M3n, Mm1 and Mmn arranged in rows and columns, a plurality of word lines W1, W2, W3 and Wm respectively coupled to the rows of the memory cells M11 to Mmn, and a plurality of bit line pairs BLP1 to BLPn. Each of the bit line pairs BLP1 to BLPn has a first bit line BL1 and a second bit line BL2, and p-channel type field effect transistors QP11, QP12, QP13 and QP14 are coupled between a source of positive voltage level Vdd and the bit lines BL1 and BL2. Since the gate electrodes of the p-channel type field effect transistors QP11 to QP14 are grounded, current paths takes place between the source of positive voltage level Vdd and the associated bit lines BL1 and BL2, respectively, at all times. The p-channel type field effect transistors QP11 to QP14 as a whole constitute a charging circuit 11.

Figure 3:
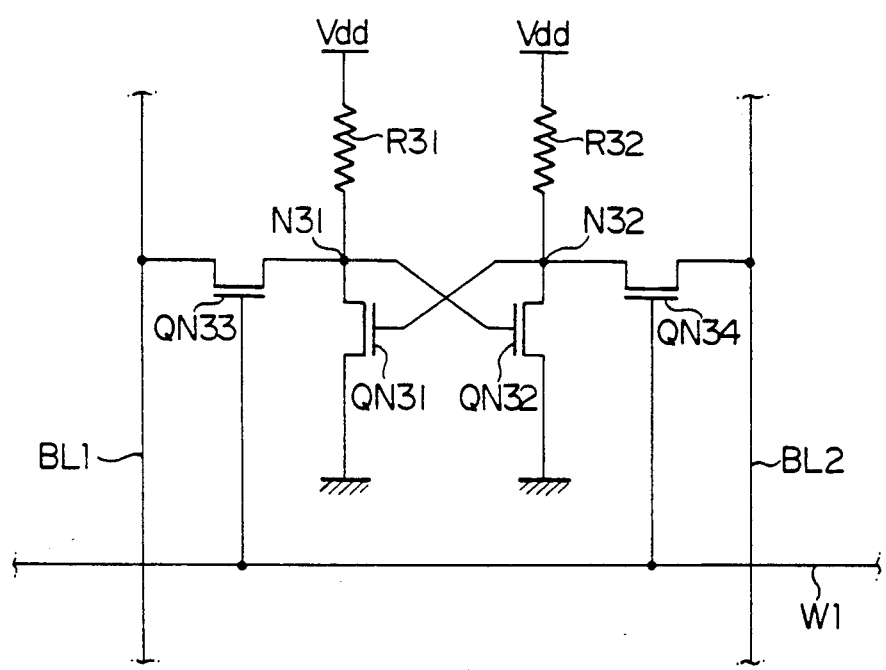
FIG. 3 is a circuit diagram showing the circuit arrangement of the memory cell incorporated in the semiconductor memory device shown in FIG. 2.

Turning to FIG. 3 of the drawings, the circuit arrangement of each of the memory cells M11 to Mmn is illustrated, and the memory cell M11, by way of example, has two series combinations of resisters R31 and R32 and n-channel type field effect transistors QN31 and QN32 coupled between the source of positive voltage level Vdd and the ground node and two n-channel type field effect transistors QN33 and QN34 coupled between the drain nodes N31 and N32 of the transistors QN31 and QN32 and the associated bit lines BL and CBL, respectively. The gate electrodes of the n-channel type field effect transistors QN31 and QN32 are coupled to the drain nodes N32 and N31, and the n-channel type field effect transistors QN33 and QN34 are concurrently gated by the associated word line W1. Each of the memory cells M11 to Mmn thus arranged memorizes a data bit in the form of difference in voltage level between the drain nodes N31 and N32, and the data bit allows one of the n-channel type field effect transistors QN31 and QN32 to turn on so as to provide a current path between the drain node of the other n-channel type field effect transistor and the ground node.

Turning back to FIG. 2, row address bits are supplied to a row address decoder unit 12, and one of the word lines W1 to Wm with a row address represented by the row address bits is shifted to an active high voltage level. When the word line goes to the active high voltage level, each of the memory cells coupled thereto provides a current path between either bit line BL1 or BL2 and a ground node through one of the n-channel type field effect transistors QN31 and QN32.

The bit line pairs BLP1 to BLPn are coupled at the other ends thereof to column selector circuits SE1 to SEn, and each of the selector circuits SE1 to SEn is constituted by two transfer gates TG1 and TG2 coupled to the bit line BL1 and BL2 of the associated bit line pair. The transfer gate is implemented by a parallel combination of a p-channel type field effect transistor and an n-channel type field effect transistor. The column selector circuits SE1 to SEn are controlled by a column address decoder unit 13, and column address bits fed to the column address decoder unit 13 are representative of a column address assigned one of the column selector circuits SE1 to SEn. Upon application of the column address bits, the column address decoder unit 13 allows the transfer gates TG1 and TG2 of the column selector circuit with the column address to concurrently turn on so that the bit lines BL1 and BL2 are conducted to data lines DL1 and DL2, respectively. The data lines DL1 and DL2 are coupled to an input/output buffer circuit 14 which supplies a data bit to an external device or the column selector circuits SE1 to SEn.

The memory cells M11 to Mmn are divided into two memory cell blocks. Namely, the memory cells M11 to M2n are incorporated in the first memory block, and the memory cells M31 to Mmn form in combination the second memory block. The bit lines BL1 and BL2 of the bit line pairs BLP1 to BLPn are also divided into two bit line sections BL11, BL12, BL21 and BL22. The first bit line sections BL11 and BL21 are associated with the first memory block and the second bit line sections BL12 and BL22 are provided for the second memory block. Between the first and second bit line sections BL11, B121, BL12 and BL22 are provided a transfer gate unit 15 and a sense amplifier unit 16 the former of which is constituted by a plurality of transfer circuits 151 to 15n and the latter of which has sense amplifier circuits 161 to 16m. Each of the transfer circuits 151 to 15n consists of two transfer gates TR1 and TR2, and each of the transfer gate TR1 or TR2 is implemented by a parallel combination of a p-channel type field effect transistor and an n-channel type field effect transistor inserted between the first and second bit line sections BL11, BL12, BL21 and BL22 of the associated bit line pair. Each of the sense amplifier circuits 161 to 16n comprises two n-channel type field effect transistors QN15 and QN16 coupled between a common node N11 and the second sections of the bit lines BL1 and BL2 of the associated bit line pair, an n-channel type field effect transistor QN17 coupled between the common node N11 and the ground node, and two p-channel type field effect transistors QP18 and QP19 coupled between the source of positive voltage level Vdd and the second bit line sections BL12 and BL22 of the associated bit line pair. The p-channel type field effect transistors QP18 and QP19 have respective gate electrodes coupled to the ground node and, therefore, serve as auxiliary charging transistors for the second bit line sections BL12 and BL22. The gate electrodes of the n-channel type field effect transistors QN15 and QN16 are coupled to the first section BL21 and the first section BL11, respectively, so that a difference in voltage level between the first sections BL11 and BL21 are transferred to the second sections BL12 and BL22 through a difference amplification as described hereinbelow. The transfer circuits 151 to 15n are responsive to a first control signal of the active high voltage level on a control signal line CTL1 and concurrently turn on. On the other hand, the n-channel type field effect transistors QN17 are responsive to a second control signal of the active high voltage level on a second control signal line CTL2 and concurrently activate the sense amplifier circuits 161 to 16n for the difference amplifications. The first control signal is produced by a control circuit 17 supplied with external control signals such as, for example, a write-in enable signal WE, and the control circuit 17 supplies the first control signal directly to the first control signal line CTL1. The first control signal is further supplied to an inverter circuit IV11, and the first control signal is inverted to the second control signal on the second control signal line CTL2. Thus, the first and second control signals are complementarily shifted between the active high voltage level and the inactive low voltage level.

Description is made on circuit behavior of the semiconductor memory device with reference to FIGS. 4A to 4F on the assumption that the memory cell M11 is accessed. The semiconductor memory device shown in FIG. 2 selectively enters a write-in mode and a read-out mode of operation depending upon the write-in enable signal WE.

Figure 4A:
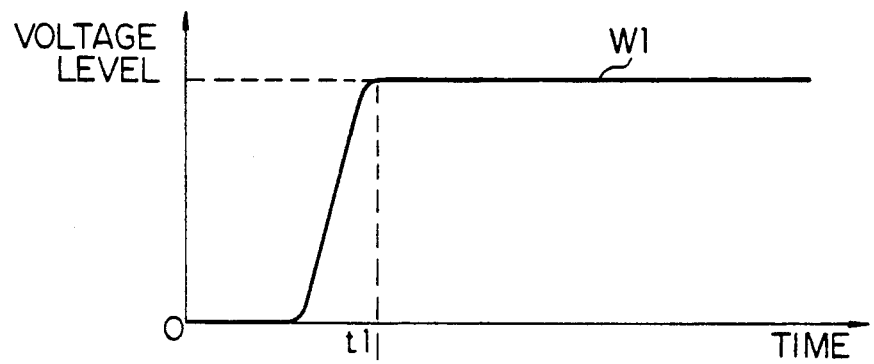
FIGS. 4A to 4F are diagrams showing the waveforms of essential signals produced in the semiconductor memory device shown in FIG. 2.

If the semiconductor memory device enters the read-out mode of operation, the control circuit 17 shifts the first control signal to the inactive low voltage level, and, accordingly, the second control signal goes up to the active high voltage level. Then, the transfer circuits 151 to 15n electrically isolate the second bit line sections BL12 and BL22 from the first bit line sections BL11 and BL21, but the sense amplifier circuits 161 to 16n are activated for the difference amplifications. Since the row address bits causes the row address decoder unit 12 to shift the word line W1 to the active high voltage level at time t1 as shown in FIG. 4A, data bits are respectively read out from the drain nodes N31 or N32 of the memory cells M11 to M1n to the associated bit line pairs BLP1 to BLPn. As described hereinbefore, each of the data bits is memorized in the form of difference in voltage level, the data bit causes one of the n-channel type field effect transistors QN31 and QN32 to turn on to provide a current path from either first bit line section BL11 or BL21 to the ground node, and, accordingly, one of the first bit line sections BL11 and BL21 is decayed in voltage level. Although differences in voltage level similarly take place on the other bit line pairs, respectively, description is hereinbelow focused upon the bit line pair BLP1 only.

Figure 4B:
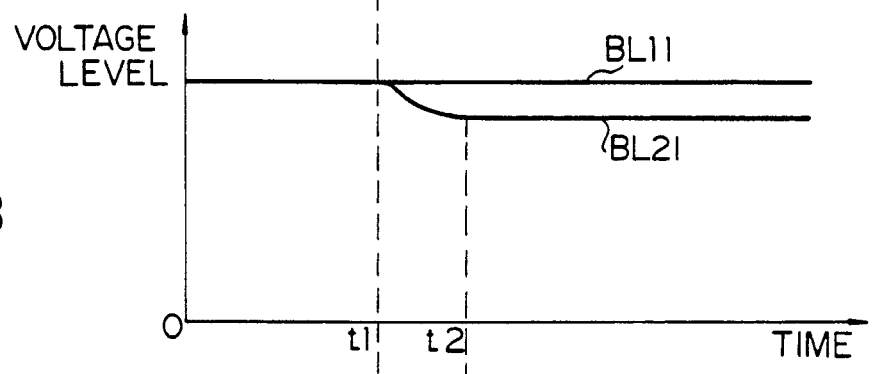
Figure 4C:
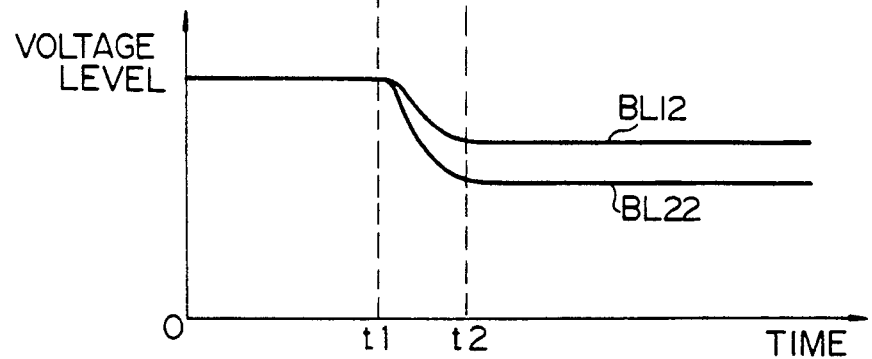

The data bit read out from the memory cell M11 is assumed to cause the first bit line section BL11 to maintain the initial high voltage level and the second bit line section BL21 to go down as shown in FIG. 4B. The voltage level on the first bit line section BL21 is determined with the ratio of resistances between the p-channel type field effect transistor QP12 and the n-channel type field effect transistor QN32. Upon production of the difference in voltage level between the first bit line sections BL11 and BL21, the n-channel type field effect transistor QN16 fully turns on to discharge current from the second bit line section BL22 to the ground node, but the n-channel type field effect transistor QN15 allows the second bit line section BL12 to be higher than the second bit line section BL22. Thus, the data bit in the form of the difference voltage is relayed to the second bit line sections BL12 and BL22 through the difference amplification of the sense amplifier circuit 161, and the voltage levels on the second bit line sections BL12 and BL22 are fixed at time t2 as shown in FIG. 4C. Thus, the first and second sections BL21 and BL22 are respectively driven by the memory cell M11 and the n-channel type field effect transistor QN16 of the sense amplifier circuit 161, and, for this reason, the data bit in the form of the difference voltage is transferred from the memory cell M11 to the column selector circuit SE1 at an improved speed.

The column address decoder unit 13 allows the transfer gates TG1 and TG2 of the column selector circuit SE1 to turn on, and the data bit is transferred to the data line pair DL1 and DL2. However, the other data bits are blocked by the other column selector circuits, and the input/output buffer circuit 14 supplies the data bit memorized in the memory cell M11 to an external device.

Figure 4D:
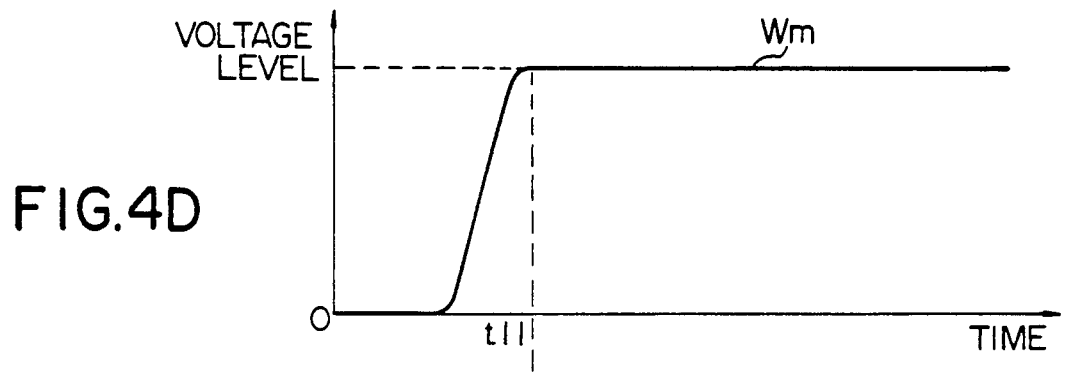
Figure 4E:
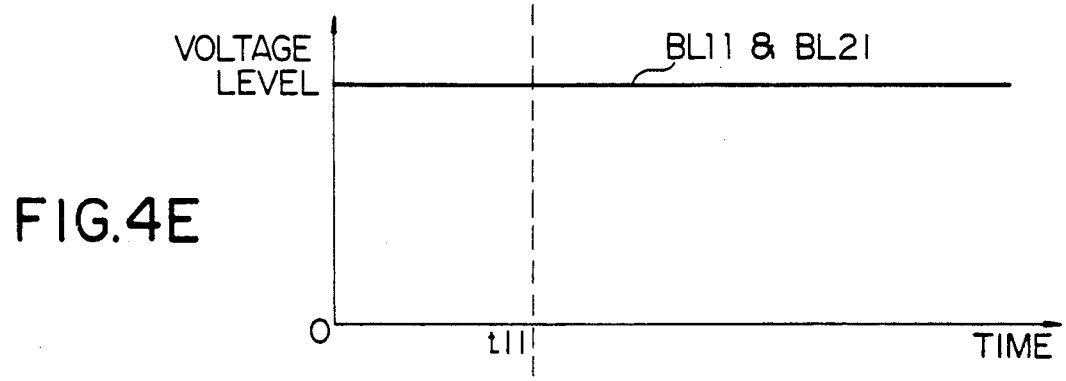
Figure 4F:
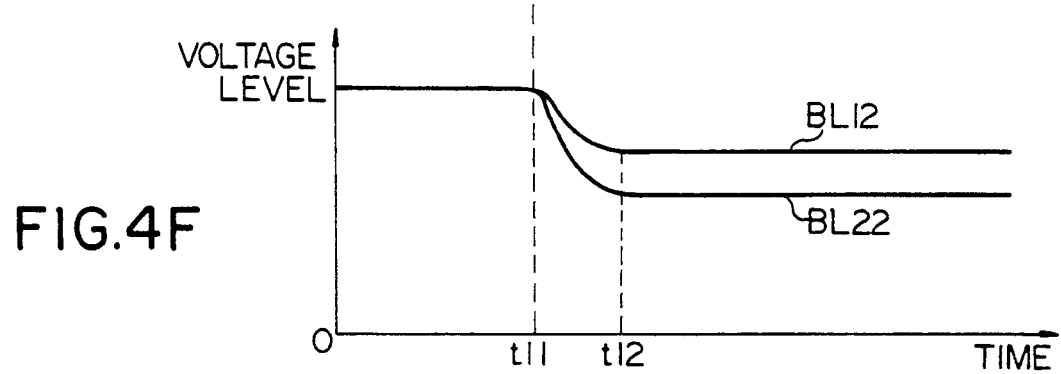

If the external device accesses the data bit memorized in the memory cell Mm1 of the second memory block by way of example, the word line Wm goes up to the active high voltage level at time t11 as shown in FIG. 4D and allows the n-channel type field effect transistors QN33 and QN34 of the memory cell Mm1 to turn on to provide a current path to the ground node, but no current path is established either first bit line section BL11 or BL21 to the ground node. The column selector circuit SE1 transfers the difference in voltage level to the data line pair DL1 and DL2, and the data bit read out from the memory cell Mm1 is supplied from the input/output buffer circuit 14 to the external device. Since no current path takes place from the first bit line sections BL11 and BL21, no voltage fluctuation takes place on the first bit line sections BL11 and BL21 as shown in FIG. 4E, but the second bit line sections BL12 and B122 are lowered to the respective voltage levels as shown in FIG. 4F. Since the memory cell Mm1 merely drives the second bit line section BL22 isolated from the first bit line section BL21, the voltage levels on the second bit line sections BL12 and BL22 quickly become constant at time t12.

When the semiconductor memory device enters the write-in mode of operation, the control circuit 17 shifts the first control signal to the active high voltage level, and the second control signal is recovered to the inactive low voltage level. A new data bit fed from the external device is converted into a difference in voltage level by the input/output buffer circuit 14, and the difference in voltage level appears on the data line pair DL1 and DL2. The column address bits causes the column address decoder unit 13 to shift the column selector circuit SE1 to the on-state, and the new data bit is transferred to the second bit line sections BL12 and BL22. If one of the memory cells in the second memory block is designated by the row address bits, the new data bit is memorized in the memory cell in the form of difference in voltage level between the drain nodes N31 and N32. On the other hand, if the memory cell M11 is, by way of example, designated by the row address bits, the word line W1 allows the n-channel type field effect transistors QN33 and QN34 to turn on, and the new data bit is transferred from the second bit line sections BL12 and BL22 through the transfer circuit 151 to the first bit line sections BL11 and BL21. The sense amplifier circuits 161 to 16n never affect the voltage level on the bit line pairs. The new data bit is, then, memorized in the memory cell M11 in the form of difference voltage between the drain nodes N31 and N32.

Second Embodiment

Figure 5:
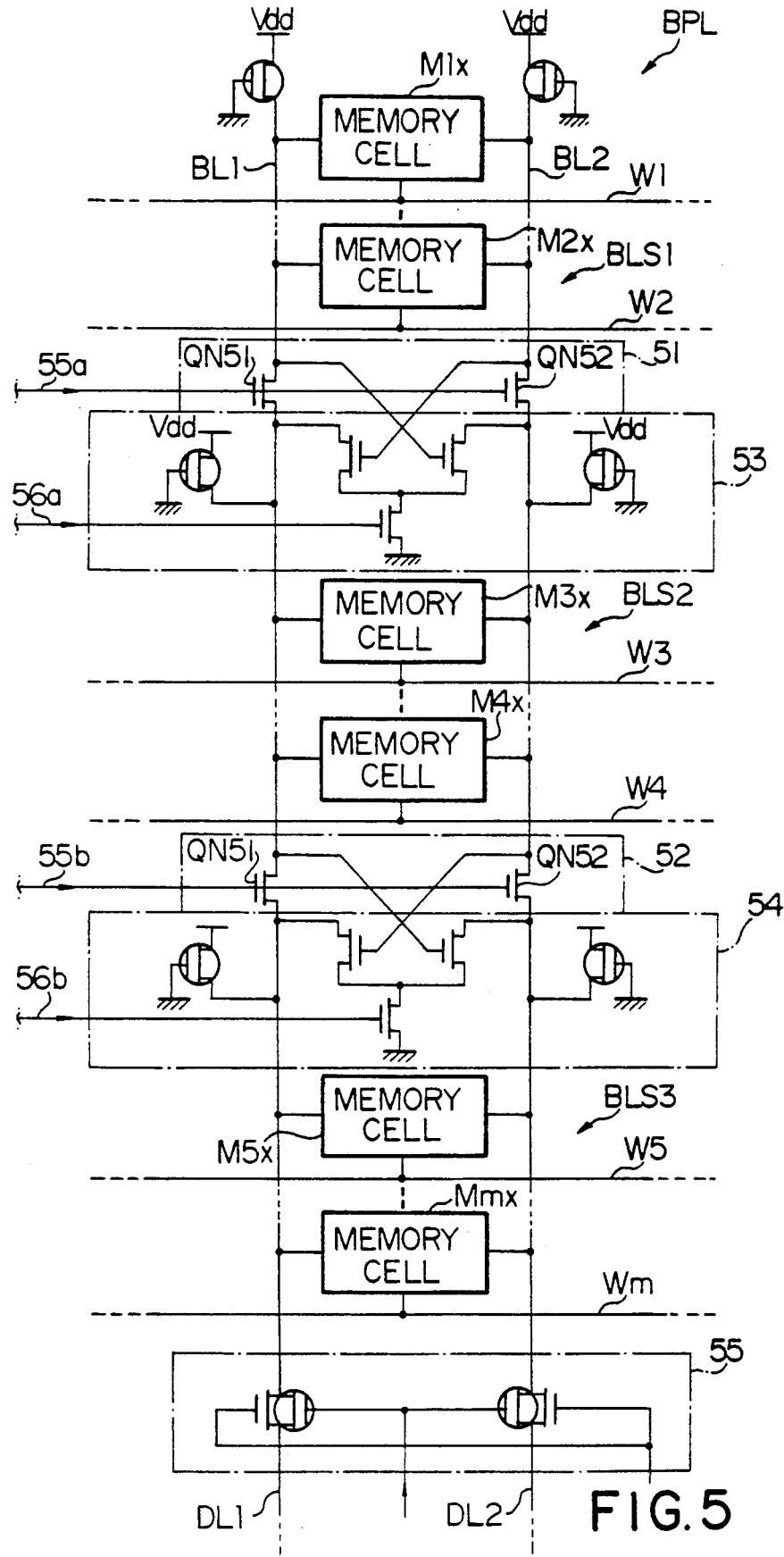
FIG. 5 is a block diagram showing the circuit arrangement of another semiconductor memory device according to the present invention.

Turning to FIG. 5 of the drawings, a column of memory cells M1x M2x, M3x, M4x, M5x and Mmx is incorporated in a memory cell array together with other columns of memory cells (not shown), and each of the memory cells M1x to Mmx is similar in circuit arrangement to that shown in FIG. 3. The memory cells M1x to Mmx are gated by word lines W1, W2, W3, W4, W5 and Wm one of which is shifted to an active level. The column of the memory cells M1x to Mmx is coupled to a bit line pair BPL consisting of first and second bit lines BL1 and BL2, and the bit line pair BPL, is divided into three bit line sections BLS1, BLS2 and BLS3. The bit line section BLS1 is coupled to the memory cells M1x to M2x, the bit line section BLS2 to the memory cells M3x to M4x, and the bit line section BLS3 to the memory cells M5x to Mmx. Gate circuits 51 and 52 are coupled between the bit line sections BLS1 and BLS2 and between the bit line sections BLS2 and BLS3, respectively, and sense amplifier circuits 53 and 54 are associated with the bit line sections BLS1 and BLS2 and with the bit line sections BLS2 and BLS3, respectively. Each of the gate circuits 51 and 52 has two n-channel type field effect transistors QN51 and QN52 gated by first and second control signals on the control signal lines 55a or 55b, and the sense amplifier circuits 53 and 54 are similar in circuit arrangement to those incorporated in the first embodiment. The sense amplifier circuits 53 and 54 are activated by third and fourth control signals on the control signal lines 56a and 56b, respectively, and the first and second control signals and the third and fourth control signals are complimentarily shifted between an active high voltage level and an inactive low voltage level, and, for this reason, the gate circuits 51 and 52 and the sense amplifier circuits 53 and 54 are alternatively provide data paths. The bit line section BLS3 is coupled to a column selector circuit 55 which in turn is coupled to a data line pair DL1 and DL2.

The other columns of memory cells are similar in arrangement to the column of the memory cell M1x to Mmx, and, therefore, the circuit behavior is generally similar thereto. As described hereinbefore, the column of the memory cells M1x to Mmx is divided into three memory blocks coupled to the three bit line sections BLS1 to BLS3, and the first and second control signals and the third and fourth control signals are concurrently shifted upon alternation of mode of operation. For this reason, the gate circuits 51 and 52 simultaneously provide conduction paths between the bit line sections BLS1 to BLS3 in the write-in mode of operation, and the sense amplifier circuits 53 and 54 are also activated in the read-out mode of operation. In this instance, the bit line section BLS1 and BLS3 serve as first and second bit line sections, respectively.

Third Embodiment

Figure 6:
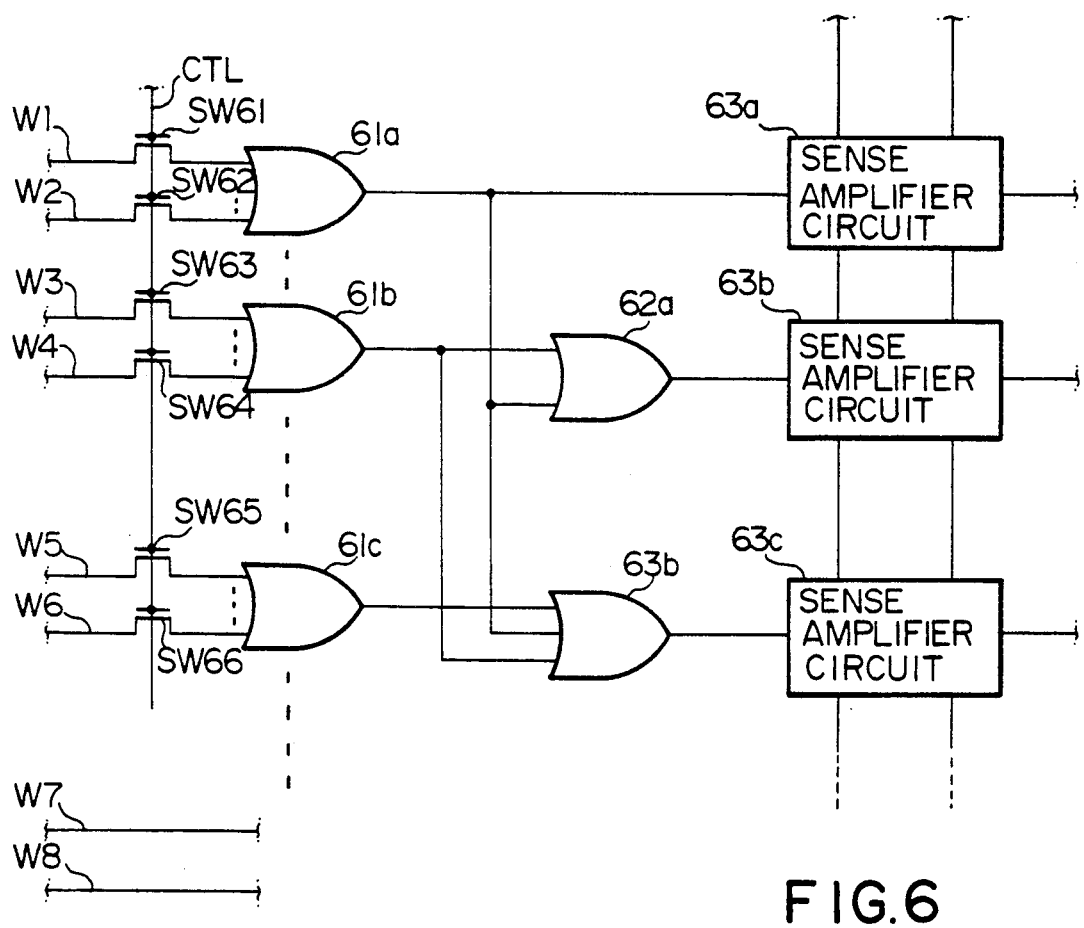
FIG. 6 is a logic diagram showing the arrangement of a controlling circuit provided for sense amplifier circuits incorporated in still another semiconductor memory device according to the present invention.

The third embodiment is similar to the second embodiment except for the number of bit line sections and control signals for sense amplifier circuits associated with the bit line sections, and description is focused upon the control signals hereinbelow. Assuming now that word lines W1 to W2, W3 to W4, W5 to W6 and W7 to W8 are coupled to memory cells of first to fourth memory cell blocks, the word lines W1 to W2, W3 to W4 and W5 to W6 are further coupled to through switching transistors SW61 to SW66 to OR gates 61a, 61b and 61c, respectively, and the output lines of the OR gates 61a to 61c are selectively coupled to OR gates 62a and 62b. Though not shown in FIG. 6, the word lines W7 to W8 are coupled to memory cells coupled to bit line sections between the sense amplifier circuit 63c and a column selector circuit. The OR gates 61a, 62a and 62b are coupled to the sense amplifier circuits 63a, 63b and 63c provided in association with two of the bit line sections of a bit line pair. The OR gates 61a, 62a and 62b are further coupled to sense amplifier circuits associated with the bit line sections of other columns of the memory cells, however, bit the other sense amplifier circuits are not shown in FIG. 6 for the sake of simplicity.

The switching transistors SW61 to SW66 are concurrently gated by a control signal on a control signal line CTL, and the control signal goes up to the active high voltage level in the read-out mode of operation. When the switching transistors SW61 to SW66 turn on, the word lines W1 to W6 are conducted to the associated OR gates 61a to 61c. Only one of the word lines W1 to W8 goes up to the active high voltage level, but the other word lines remain in the inactive low voltage level. If one of the word lines W1 to W2 goes up to the active high voltage level, the OR gate 61a activates all of the sense amplifier circuits 63a to 63c, and a data bit read out on the associated bit line pair is transferred from bit line section to bit line section through difference amplifications of the sense amplifier circuits 63a to 63c. However, if one of the word lines E3 to W4 goes up to the active high voltage level, the OR gates 62a and 62b activates the sense amplifier circuits 63b and 63c, but the sense amplifier circuit 63a is never activated. Similarly one of the word lines W5 to W6 allows the OR gate 63b to activate the sense amplifier circuit 63c only. Only the sense amplifier circuits necessary for data propagation to the column selector circuit are, thus, activated with the OR gates 61a to 61c, 62a and 62b, and current consumption of the third embodiment is decreased in comparison with the second embodiment.

Although particular embodiments of the present invention have been shown and described, it will be obvious to those skilled in the art that various changes and modifications may be made without departing from the spirit and scope of the present invention. For example, each of the bit line pairs may be divided into more than four bit line sections, and the memory cell may have another circuit arrangement.

What is claimed is:

1. A semiconductor memory device comprising:
   (a) a plurality of memory cells arranged in rows and columns and respectively storing data bits each in the form of difference in voltage level, each column of said memory cells being divided in a plurality of memory blocks including first and second memory blocks;
   (b) a plurality of bit line paris each divided into a plurality of bit line sections respectively coupled to said memory blocks of each of said columns of said memory cells, said bit line sections of each bit line pair including first and second bit line sections respectively coupled to said first and second memory blocks;
   c) a plurality of word lines coupled to said rows of said memory cells and activating one of said rows of said memory cells for conducting said memory cells coupled to said one of said word lines to said bit line pairs, respectively;

d) charging means for supplying current to said first bit line section of each bit line pair;

e) a plurality of column selector circuits each coupled to said second bit line section of each bit line pair, said column selector circuits being operative to transfer a new data bit or one of said data bits between a data line pair and said second bit line section of one of said bit line paris;

f) a plurality of gate circuits each coupled between two of said bit line sections and responsive to a first controlling signal for transferring said new data bit between said two of said bit line sections; and g) a plurality of sense amplifier circuits each provided in association with two of said bit line sections and responsive to a second controlling signal for transferring said data bits read out from said memory cells coupled to said one of said word lines between said two of said bit line sections through a difference amplification, in which each of said memory cells coupled to said one of said word lines provides a current path from one of the first and second component bit lines of the associated bit line pair to a constant voltage source, in which each of said sense amplifier circuits comprises first and second amplification transistors having respective source-to-drain paths respectively coupled between said first and second component bit lines of one of said two bit line sections of said associated bit line pair and a common node, an activating transistor coupled between said common node and said constant voltage source, and in which said first and second amplification transistors have respective gate electrodes coupled to said second and first component bit lines of the other of said two bit line sections of said associated bit line pair.

2. A semiconductor memory device as set forth in claim 1, in which said first control signal allows all of said gate circuits to provide respective conduction path in a write-in mode of operation.

3. A semiconductor memory device as set forth in claim 2, in which said second control signal activates all of said sense amplifier circuits in a read-out mode of operation.

4. A semiconductor memory device as set forth in claim 2, in which said second control signal activates said sense amplifier circuits provided in association with those from said bit line sections coupled to said memory cells activated by said one of said word lines to said second bit line sections.

5. A semiconductor memory device comprising:

a) a plurality of memory cells arranged in rows and columns and divided into a plurality of memory blocks including first and second memory cell blocks, said memory cells respectively storing data bits each in the form of difference in voltage level;

b) a plurality of bit line pairs divided into a plurality of bit line sections coupled to said memory blocks, said bit line pairs including first bit line sections coupled to said first memory cell block and second bit line sections coupled to said second memory cell block;

c) a charging circuit coupled to said first bit line sections of said bit line pairs and supplying currents to said first sections;

d) a plurality of word lines respectively coupled to said rows of said memory cells and conducting one of said rows of said memory cells to said bit line pairs, respectively, on the basis of row address bits, each of said memory cells in said one of said rows providing a current path from one of the first and second component bit lines of the associated bit line pair to a constant voltage source;

e) a data line pair for propagating a data bit in the form of difference in voltage level in a read-out mode and a write-in mode of operation;

f) column selector circuits coupled to said second sections of said bit line pairs and transferring said data bit between said data line pair and one of said second bit line sections on the basis of column address bits;

g) a plurality of gate circuits each coupled between two of said bit line sections and responsive to a first controlling signal in said write-in mode of operation for conducting said two of said bit line sections to each other; and h) a plurality of sense amplifier circuits each provided in association with two of said bit line sections and responsive to a second controlling signal in said read-out mode of operation for transferring said data bits read out from said one of said rows of said memory cells between said two of said bit line sections, in which each of said sense amplifier circuit comprises first and second field effect transistors having respective source-to-drain paths respectively coupled between said first and second component bit lines of one of said two bit line sections of said associated bit line pair and a common node, a third transistor coupled between said common node and said constant voltage source, and charging transistors for supplying currents to said second section of said associated bit line pair, and in which said first and second amplification transistors have respective gate electrodes coupled to said second and first component bit lines of the other of said two bit line sections of said associated bit line pair.

* * * * *